(12) United States Patent
Nadeau-Dostie et al.

(10) Patent No.: US 6,327,684 B1
(45) Date of Patent: *Dec. 4, 2001

(54) METHOD OF TESTING AT-SPEED CIRCUITS HAVING ASYNCHRONOUS CLOCKS AND CONTROLLER FOR USE THEREWITH

(75) Inventors: Benoit Nadeau-Dostie, Aylmer; Naader Hasani, Ottawa; Jean-François Coté, Aylmer, all of (CA)

(73) Assignee: Logicvision, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/309,827

(22) Filed: May 11, 1999

(51) Int. Cl.[7] .................................................. G01R 31/28
(52) U.S. Cl. .............................................................. 714/731
(58) Field of Search ................................... 714/726, 727, 714/729, 731

(56) References Cited

U.S. PATENT DOCUMENTS

| | | | |
|---|---|---|---|
| 5,008,618 | * 4/1991 | Van Der Star | 714/729 |
| 5,349,587 | 9/1994 | Nadeau-Dostie . | |
| 5,504,756 | * 4/1996 | Kim et al. | 714/729 |
| 5,680,543 | * 10/1997 | Bhawmik | 714/30 |
| 5,805,608 | * 9/1998 | Baeg et al. | 714/726 |
| 6,115,827 | * 9/2000 | Nadeau-Dostie et al. | 713/503 |
| 6,131,173 | * 10/2000 | Meirlevede et al. | 714/726 |

OTHER PUBLICATIONS

IBM Technical Disclosure Bulletin, Nov. 1995, US vol. No.: 38, Issue No.: 11, p. No.: 499–500 Publication–Date: Nov. 1, 1995.*

* cited by examiner

*Primary Examiner*—Albert Decady
*Assistant Examiner*—Joseph D. Torres
(74) *Attorney, Agent, or Firm*—Sheridan Ross P.C.

(57) ABSTRACT

A method of testing the core logic in a digital system, the method having a sequence of test operations including a shift-in operation in which a test stimulus is shifted into scanable memory elements in the core logic, a capture operation in which data in the memory elements is captured, and a shift-out operation in which captured data is shifted out of the core logic for analysis, comprises the improvement of, for each the test operation, concurrently enabling the domain clock of each clock domain in the core logic at the beginning of each test operation, performing the test operation in each domain and disabling the domain clock at the end of each test operation in each domain. The method allows all of the clock domains, including signal paths which traverse domain boundaries and/or have multi-cycle paths to be tested concurrently and at their respective functional clock rate of each clock.

31 Claims, 3 Drawing Sheets

METHOD OF TESTING AT-SPEED CIRCUITS HAVING ASYNCHRONOUS CLOCKS AND CONTROLLER FOR USE THEREWITH

The present invention relates to methods and apparatus for testing digital systems including integrated circuits and, more specifically, to built-in self testing of integrated circuits having multiple clock domains with asynchronous clocks and non-integer frequency ratios.

BACKGROUND OF THE INVENTION

Testing of digital systems, such as the core logic of an integrated circuit, is typically performed by loading a test pattern or stimulus into scanable memory elements of the system, capturing the response of the elements to the test stimulus, shifting the test response out of the system and then comparing the response to the response which should have been obtained if the system was operating according to design. Difficulties arise when signals cross the boundary between clock domains having different clock frequencies. Since the elements in one domain operate at a different frequency from that of other domains in the system, special provisions must be made during testing to ensure that signals traversing clock domains are synchronized. Otherwise, the test response from the system will not be repeatable and test results will be unreliable. The problem is especially severe in built-in self-test systems.

Methods have been developed for testing systems in which the ratio of the frequencies of two clock domains is an integer. However, it is not uncommon for digital systems to employ asynchronous clocks whose frequencies are not multiples of each other. For example, one clock domain could employ a clock rate of 200 MHz and other domain could employ a clock rate of 78 MHz, resulting in a non-integer frequency ratio of 2.564 . . . Solutions have yet to be developed for clock domains having non-integer frequency ratios. Testing of such systems using the functional system clocks is difficult because the phase relationship between the system clocks is not known and is variable over time. The term "functional system clock" refers to the normal operating frequency of a digital system or portion thereof. In order to achieve very high reliability circuits, it is essential that all clock domains be tested at full-speed.

Heretofore, such circuits have been tested by using test clock rates that are essentially the same as the functional clock rates but disabling all signal paths crossing clock domain boundaries and repeating the test for each clock domain. The primary drawbacks of this approach are that part of the logic is not tested and a series of tests must be performed in order to test all parts of the system. However, even then, it is not possible to obtain results for all parts of the system operating concurrently at speed.

It is also known to use test clock rates that are as close as possible to those of the functional clocks without exceeding the functional clock rates and that are multiples of each other. This is done by using the fastest functional clock as the test clock for the domain with the fastest clock rate and generating the test clocks required by other clock domains from the main test clock signal using a simple clock divider. For example, in a system having one clock domain with a functional clock frequency of 200 MHz and another clock domain with a clock frequency of 78 MHz, test clock rates of 200 MHz and 50 MHz would be used for testing. Nadeau-Dostie et al U.S. Pat. No. 5,349,587 granted on Sep. 20, 1994 for "Multiple Clock Rate Test Apparatus for Testing Digital Systems" and Bhawmik U.S. Pat. No 5,680,543 granted on Oct. 21, 1997 for "Method and Apparatus for Built-In Self-Test With Multiple Clock Circuits" illustrate the latter approach. Clearly, the primary drawback of this approach is that one of the clock domains is not tested at its full-speed (78 MHz).

It is also possible to combine the above methods sequentially. The drawbacks of this approach are longer test times, more complex test circuitry than is desirable and the inability of simultaneously or concurrently testing all components at their functional clock rates.

Thus, there is a need for testing method and circuitry which enables the testing at the design or functional speed of digital systems having two or more clock domains with asynchronous clocks whose frequencies are not multiples of one another.

SUMMARY OF THE INVENTION

One aspect of the present invention provides a scan-based method of testing a digital system, the method including a sequence of test operations including a shift-in operation in which a test stimulus is shifted into scanable memory elements in the system, a capture operation in which data in said memory elements is captured, and a shift-out operation in which captured data is shifted out of said core logic for analysis, the method comprising, for each said operation, concurrently enabling the domain clock of each clock domain in the system at the beginning of each test operation; performing the test operation in each domain; and disabling the domain clock at the end of each test operation in each domain.

The test method allows test vectors to be applied and responses to be extracted at-speed within each clock domain and the structural interface between the clock domains to be tested at-speed. The test signature obtained from the circuit when tested in this manner does not change even if the system clock frequencies change and the test signature and fault coverage can be computed using a fast combinational fault simulator in a single operation because the test controllers provided to implement the method can be programmed such that they appear to be a single test controller.

A further advantage of the method is that it allows a system to be tested using a tester that cannot provide the exact frequencies used during normal operation of the system or that can provide only one high-speed clock for initial manufacturing of the circuit and yet still obtain the same test signature. This considerably simplifies test data management.

Still further, the method also allows the timing between clock domains to be made robust to make the circuit response repeatable. The verification of the timing during the test mode is simple.

The method is able to accommodate an arbitrary number of asynchronous clock domains and the circuitry to accommodate them is readily scalable.

Still further, the method of the present invention can readily handle another problem which has plagued circuit designers and that is the problem posed by circuits having multi-cycle paths. Multi-cycle paths result when more than one clock cycle is required for a signal to propagate from the output of one memory element to the input of another. Many test methods do not accommodate multi-cycle paths and therefore may produce invalid test results.

Another aspect of the present invention involves the provision test circuitry for performing the method of the present invention. The present invention provides an on-chip self-synchronizing test controller for each frequency domain. Each controller employs a generic asynchronous hand-shaking protocol to synchronize test operations in such a manner that the circuit test responses are inherently repeatable.

Each test controller disables its domain output clock at the end of a test operation, generates a clock disabled signal and applies the signal to all test controllers, and then waits for other controllers to do the same. The clock controller does not re-enable its clock until it has received a corresponding clock disabled signal from all of the other test controllers. Thus, controllers with fast clocks complete their respective phase of a test operation before controllers with slower clock rates and then simply wait for the other controllers to catch up. The next operation in the sequence of operations is started in all clock domains when all controllers have completed their phase of the test. This allows elements at opposite ends of cross-boundary signal paths to be synchronized and the required number of clock cycles to be executed for elements located on multi-cycle path signals.

Accordingly, another aspect of the present invention provides a clock controller for use in a test controller in a digital system, comprising a detector for receiving a disabled clock signal from all clock domains in said system and outputting a clock start signal when an active disabled clock signal has been received from all of said clock domains; and a clock generator for generating a clock signal at a predetermined clock rate when an active clock start signal is received from said detector and a disabled clock signal when an inactive clock signal is received from said detector.

BRIEF DESCRIPTION OF THE DRAWINGS

These and other features of the invention will become more apparent from the following description in which reference is made to the appended drawings in which.

DETAILED DESCRIPTION OF PREFERRED EMBODIMENTS OF THE INVENTION

Figure 1:
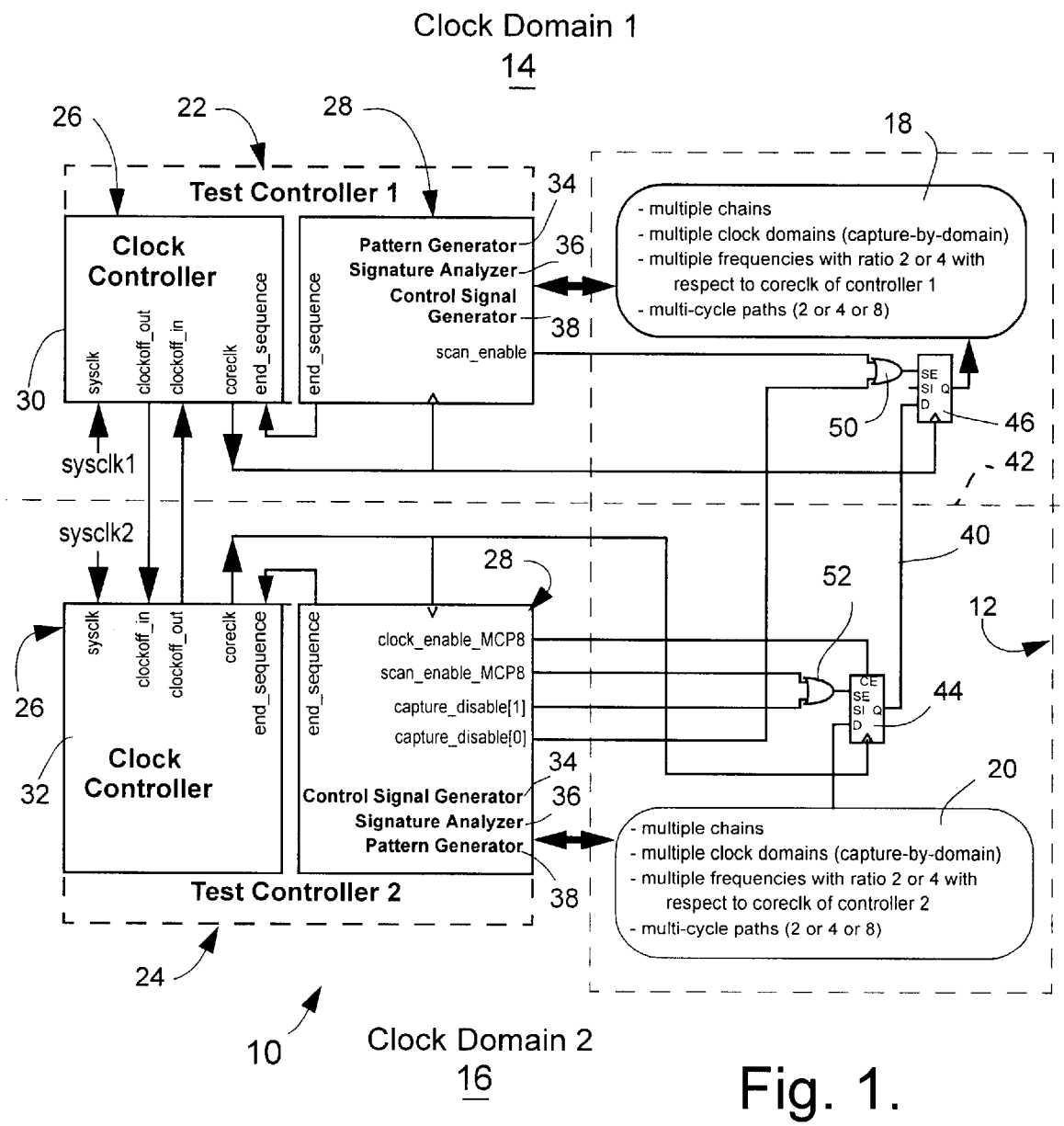
FIG. 1 diagrammatically illustrates a circuit having two asynchronous clock domains.

FIG. 1 illustrates a portion of an integrated circuit 10 having core logic 12 with two clock domains 14 and 16. It is to be understood that the core logic may have any arbitrary number of clock domains.

Clock domains 14 and 16 include functional circuitry 18 and 20, respectively, comprised of flip-flops and combinational logic. The flip-flops are scanable memory elements which may be arranged in multiple scan chains, multiple clock domains with frequency ratios which are multiples of the domain base clock and which may have multi-cycle paths (discussed later). The term "scanable memory element" refers to elements which can be configured in either a scan or shift mode or a capture mode. Each clock domain 14 and 16 is designed to operate, in normal mode, at a predetermined functional clock frequency. Although the present invention is particularly concerned with frequency ratios which are not an integer, the invention will also readily handle frequency ratios which are an integer.

Each clock domain is provided with a test controller. A test controller 22 is associated with clock domain 14 and a test controller 24 is associated with clock domain 16. Each test controller includes an input, sysclk, for receiving a domain base clock signal and an output, coreclk, outputting a gated clock signal. A domain base clock signal, sysclk1, is applied to the sysclk input of test controller 22 which outputs gated clock signal coreclk1. Similarly, a domain base clock signal, sysclk2, is applied to the sysclk input of test controller 24 which outputs gated clock signal coreclk2.

Test controllers are generally well known in the art and, accordingly, the test controllers will not be described in detail except for the components thereof which are modified to achieve the objectives of the present invention. In FIG. 1, each test controller is divided into two sections 26 and 28. Section 26 is a clock controller which operates at its domain base clock rate. Clock controller 30 is associated with clock domain 14. Clock controller 32 is associated with clock domain 16. Section 28 comprises other test controller sub-circuits which are driven by the coreclk signal output by the clock controller. Generally, the sub-circuits include a pattern generator 34 for generating test vectors or stimuli to be shifted into the scanable memory elements, a signature analyser 36 for analysing the results of a test, and a control signal generator 38 for generating appropriate signals at the appropriate times during test operations. The clock controller is shown separately from the other test controller sub-circuits because it is the only sub-circuit which needs to be modified to implement the method described herein. The other sub-circuits, may be the same as those known in the prior art.

The domain base clock signal, sysclk, is used to clock components within the clock controller. Coreclk is derived from sysclk and is used to clock components in the functional circuitry and, as mentioned above, in the other sub-circuits of the test controllers. The frequency ratio of sysclk1 to sysclk2 (or sysclk2 to sysclk1) is arbitrary. In the description which follows, the clock rate of sysclk2 is assumed to be greater than that of sysclk1. Inside each domain, there could be other clock signals whose frequency ratio with respect to the coreclk is an integer. Methods for dealing with the synchronization in such cases are known (e.g. Nadeau-Dostie et al U.S. Pat. No. 5,349,587).

Clock domains may communicate with one another along one or more cross-boundary signal paths originating in one clock domain and terminating in another clock domain. To test the logic associated with cross-boundary signals, a scanable control element is provided at the source and destination ends of each cross-boundary signal. FIG. 1 illustrates one cross-boundary signal path 40 which originates in domain 16, traverses domain boundary 42 and terminates in domain 14. A source control element 44 is associated with clock domain 16 and forms a part of the functional circuit 20 associated with test controller 24. A destination control element 46 is associated with clock domain 14 and forms a part of the functional circuit 18 associated with test controller 22. Each control element is provided with a scan enable input, SE. Source control elements are additionally provided with a clock enable input, CE. The output of source control element 44 is the source of signal path 40 which terminates at the Data input, D, of destination control element 46.

The functional circuitry of the core logic may also contain multi-cycle paths. Multi-cycle paths are signal paths which require more than one clock period for a signal to propagate from its source to its destination. Co-pending U.S. application Ser. No. 08/752,499 filed Nov. 20, 1996 for "Method and Apparatus for Scan Testing Digital Circuits", assigned to the present assignee and incorporated herein by reference, describes a method of synchronizing test operations in this case. Also, fixed clock skew between the clock domains can be handled by the method described in co-pending U.S. application Ser. No. 09/209,790 filed Dec. 11, 1998 for "Clock Skew Management Method and Apparatus", assigned to the present assignee and incorporated herein by reference. As will be seen, the present invention makes use of both methods described.

One of the test controllers is designated as a primary controller. The primary controller controls the capture configuration of all of the destination control elements in the circuit and does so by applying shareable capture_disable [x] signals discussed later. All other test controllers are considered secondary controllers. Preferably, the primary controller is the controller associated with the domain having the highest clock frequency, which is test controller 24 in the circuit illustrated in FIG. 1.

It will be seen from FIG. 1 that each controller applies a scan_enable signal to a scan enable input, SE, of each control element in its domain via an OR gate 50. An active scan_enable signal configures the control element in scan or shift mode for either shifting a test pattern into and/or through the element or for shifting captured data out of the element. An inactive scan_enable signal places the element in a capture mode for capturing the data at its input. It should be noted here that the term "active" when referring to a signal refers to a high level signal (1) while the term "inactive" refers to a low level signal (0).

As mentioned, the primary controller applies a signal, capture_disable[x] to the input of all control elements in all clock domains and, therefore, operates to control the capture configuration of the cross-boundary control elements. Capture_disable[1] is applied to the scan enable input of source elements while capture_disable[0] is applied to the scan enable input of the associated destination control element. In general, at the appropriate time, the primary controller either configures the source element in hold mode and its associated destination element in capture mode or configures the source element in capture mode and its associated destination element in shift or hold mode.

Each controller also applies the signals clock_enable_MCP8 and scan_enable_MCP8 to the clock_enable input, CE, and the scan_ enable input, SE, respectively, of source control element in its clock domain. In the circuit of FIG. 1, there are no source control elements in clock domain 14 and, therefore, test controller 22 is not shown with such outputs. However, clock domain 16 does have one source control element 44. Scan_enable_MCP8 is applied to control element 44 through OR gate 52. These signals are generated in the manner described in aforementioned application Ser. No. 08/752,499 and cause source flip-flop 44 in clock domain 16 to enter a hold state eight clock cycles before the capture edge of corelclk2. Capture_disable[1] is applied to one input of OR gate 52 and, when active, causes source flip-flop 44 to remain in the same state eight clock cycles after the capture edge of coreclk2, as described in aforementioned application Ser. No. 09/209,790. Clock_disable[0] is connected to the destination flip-flop of domain 14 through OR gate 50 and is inactive when clock_disable[1] is active to allow the destination flip-flop to capture the data output by the source flip-flop 44 in domain 18.

It should be appreciated that even though FIG. 1 shows only one cross-boundary signal path between clock domains 14 and 16, many more such paths could exist. Signal paths can originate from any domain and terminate in any other domain. The signal paths could also traverse combinational logic (not shown). Since the clocks controlling the source and destination flip-flops are asynchronous with respect to each other, the time interval between the active edges of coreclock2 and coreclock1 is generally unknown and variable over time, the output of destination flip-flop of clock domain 14 normally cannot be predicted and the signature calculated by the signature analyser will not be repeatable.

In order to overcome this problem, the present invention synchronizes the start of each test operation, i.e. the shift-in, capture and shift-out operations, in all of the clock domains and stops the domain clock in each domain when it has completed its phase of the test operation. The next test operation in the sequence of test operations is not initiated until all domain clocks in all clock domains have been stopped, i.e. until all clock domains have completed their respective phase of the current test operation. This provides the time necessary to configure the cross-boundary control elements prior to executing a capture cycle and execute the number clock cycles necessary to permit signals to traverse multi-cycle paths. In this way, it is possible to test all clock domains concurrently while operating each domain at its own functional, or at speed, clock rate. In fact, since the test controllers are self-synchronizing (as will be seen), the present invention allows tests to be performed while operating the clock domains at any desired clock rate. Most importantly, the method of the present invention allows circuits with asynchronous clocks with non-integer frequency ratios and cross-boundary signal paths to be tested reliably at full speed. Thus, the invention is consistent with the objective of achieving very high reliability circuits.

In order to perform the test method of the present invention, the clock signal generator 34 of each test controller is arranged to generate an active end_sequence signal that indicates that the test controller has completed a particular test operation (shift or capture sequence) and applies the signal to its associated clock controller. In the description which follows, end_sequence1 is the end_sequence signal generated within test controller 22 while end_sequence2 is the end_sequence signal generated within test controller 24. The clock controller responds to that signal in a manner explained later.

The clock controller also receives a clock status signal, shown as clockoff_in in the drawings, from the test controller of each of the other clock domains in the core logic. In the circuit illustrated in FIG. 1, there is only one other domain and, thus, there is only one clockoff_in input. An active clock status signal appearing at the clockoff_in input indicates that the test controller in the other clock domain has completed its phase of the test operation, a shift or a capture sequence, and that its clock has been stopped whereas an inactive clock status signal indicates that the test operation is still in progress in the remote domain. The clock controller generates an equivalent clock status signal, shown as clockoff_out, when its test controller completes a test operation and applies the signal to the clock controller of all of the other test controllers in the circuit where the signal is received as the clockoff_in signal mentioned above.

Figure 3:
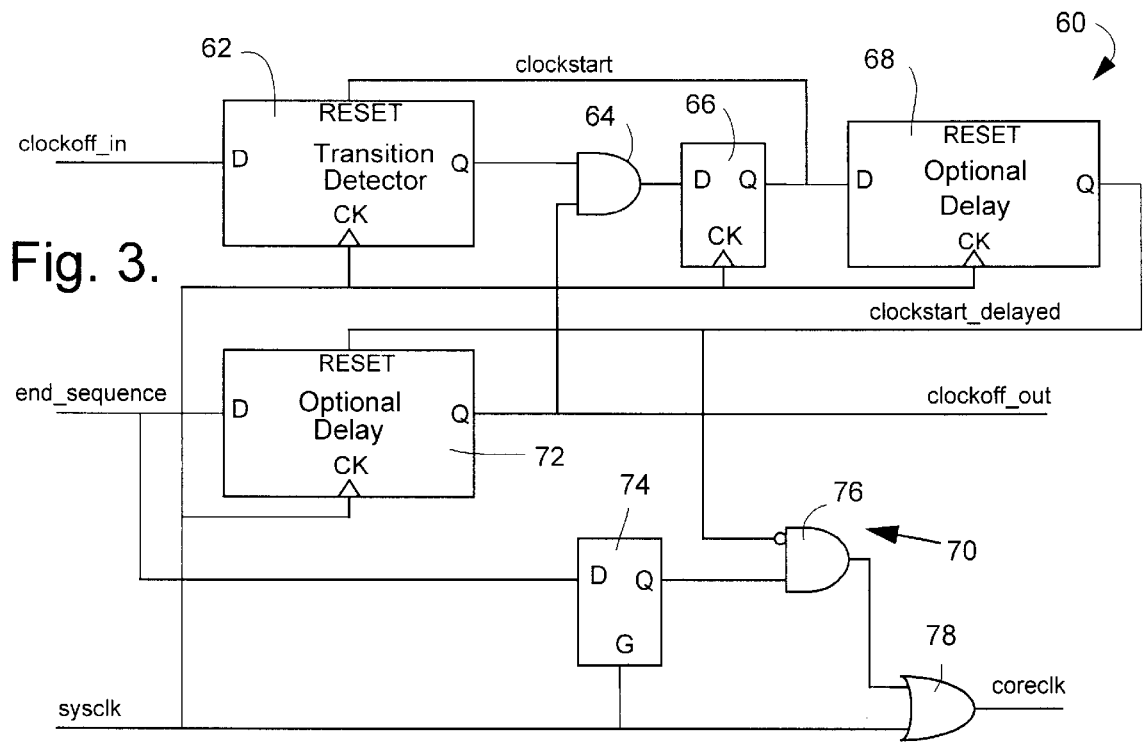
FIG. 3 diagrammatically illustrates a logic diagram of clock controller sub-circuit in accordance with a preferred embodiment of the present invention.
Figure 4:
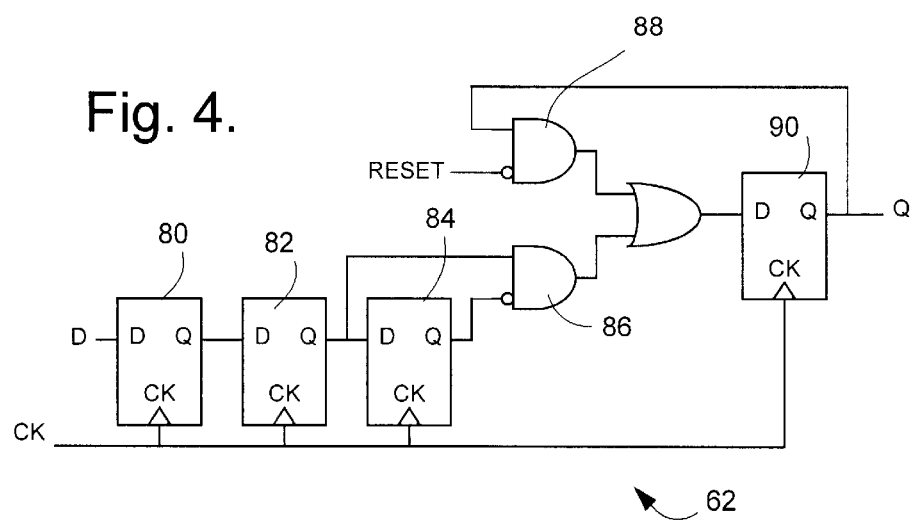
FIG. 4 is a circuit logic diagram of a transition detector sub-circuit in accordance with a preferred embodiment of the present invention.

Reference will now be made to FIGS. 3 and 4 which diagrammatically illustrate a preferred embodiment of the clock controller circuitry adapted to implement the method of the present invention and which is incorporated in all of the test controllers. It is to be understood that clock controllers typically perform several other functions, such as providing a divided down version of the domain base clock, sysclk, to the functional circuit, interrupting (or freezing) coreclk for diagnostic purposes, modulating coreclk to adjust power consumption during test modes, as described in co-pending U.S. application Ser. No. 09/218,764 filed Dec. 11, 1998 for "Method and Apparatus for Controlling Power Level During BIST", assigned to the present assignee and incorporated herein by reference, and other functions. Such other functions are not illustrated or described herein. These and other clock manipulation functions can and typically would be incorporated into the clock controller.

In general, each clock controller includes a clock status signal detector 60 for receiving the clock status signal from each clock domain in the system. The detector outputs a clockstart signal which is active when an active clock status signal has been received from all clock domains and inactive when any one or more clock status input signals is inactive. Each clock controller also includes a clock gating circuit 70 which receives the domain base clock signal, sysclk, the clock status signal and the domain end_sequence signal and outputs the domain operational clock signal, coreclk, and a domain clock status output signal, clockoff_out. The gating circuit enables the operational clock signal, coreclk, when an active clockstart signal is received from the detector and disables the operational clock signal when an active end_sequence signal is received from its associated control signal generator.

With reference to FIG. 3, clock status signal detector circuit 60 includes a transition detector 62, illustrated in detail in FIG. 4, for each clock domain in the circuit. Thus, if the circuit had, say, five clock domains, the controller would have four transition detectors, one for each of the other clock domains. Circuit 60, further includes an AND gate 64 which receives the output of each of the transition detectors, a re-timing flip-flop 66 which re-times the output of the AND gate and an optional delay circuit 68. All components are clocked by the domain base clock signal, sysclk, of the domain in which the clock controller is resident.

Each transition detector receives the clock status signal, clockoff_in, from its associated remote clock domain. When the clock status input becomes active, the transition detector detects the active edge of the signal and then outputs an active signal detected signal to the AND gate and holds that output until the detector is reset. The transition detector will be reset only after all of the transition detectors in the clock controller have detected active clock status signals. When the clock status signal is inactive, the detector outputs an inactive signal detected signal.

While a test operation is in progress, the output of the AND gate 64 will be inactive as long as the output of any of the transition detectors is inactive. When all of its inputs are active, the output of the AND gate becomes active. Flip-flop 66 re-times the output and produces a clockstart signal which is applied to the input of the optional delay circuit 68 and to the reset input of each of the transition detectors 62. When the transition detectors are reset, their outputs become inactive which causes the output of the AND gate to also become inactive. Thus, the clockstart signal is active for only one clock cycle of sysclk. After a predetermined delay, delay circuit 68 outputs a clockstart_delayed signal to clock gating circuit 70. As with the clockstart signal, the clockstart_delayed signal will have a duration of one clock cycle of sysclk.

Clock gating circuit 70 includes an optional delay circuit 72, a transparent latch 74, an AND gate 76 and an OR gate 78. Delay circuit 72 receives the end_sequence signal output by the control signal generator 38 and outputs a domain clock status signal to each of the other test controllers. An active end_sequence signal causes an active domain clock status signal, clockoff_out, to be output after a predetermined number of sysclk clock cycles, indicating that the clock has been turned off. The number of predetermined clock cycles depends on circuit parameters and the frequency ratio of the clock frequencies involved. Generally, a delay of four clock cycles provides safe operation of the circuit for a wide range of conditions while not significantly impacting the test length. The output of the optional delay element 72 remains active until the reset signal (clockstart or clockstart_delayed if present) becomes active. A simple shift register or a counter can be used to implement this delay element. The optional delay is only required if the clock controller implements the method and circuitry for controlling the average power dissipated by a circuit under test as described in aforementioned application Ser. No. 09/219,764.

While end_sequence is inactive, the clock status signal is also inactive. The test controller is designed to make end_sequence inactive consequent to the receipt of the first coreclk clock cycle after the end_sequence signal becomes active. As explained below, an active end_sequence signal stops coreclk. Since coreclk is output by the section of the test controller which is driven by coreclk, the end_sequence signal may be active for many cycles of the domain base clock signal, sysclk. Thus, the circuit inherently holds end_sequence active until all domains have completed their respective phase of a test operation.

As shown in FIG. 3, the domain clock status signal is also applied to one input of AND gate 64 of its associated clock status signal detector circuit 60. In an alternative arrangement (not shown), the end_sequence signal may be applied to a transition detector 62 in circuit 60 associated with the local clock domain.

The end_sequence signal is also applied to the transparent latch 74, in order to retime the signal. The retimed end_sequence signal is applied to one input of AND gate 76. The clockstart (or clockstart_delayed) signal is inverted and applied to the other input of AND gate 76. The output of the AND gate is inactive when either end_sequence is inactive or clockstart is active and becomes active when end_sequence becomes active (clockstart is always inactive at this time, as will be explained). OR gate 78 receives the output of AND gate 76 and the domain base clock signal, sysclk. When the output of the AND gate is inactive, the OR gate outputs a gated version of sysclk as coreclk. However, when the output of the AND gate becomes active, corelck is forced high and held high, thereby stopping the clock until clockstart becomes active.

FIG. 4 illustrates an embodiment of a transition detector sub-circuit 62. The primary objective of the circuit is to detect an active transition of the clock status signal, clockoff_in, (a 0 to 1 transition in this example) and to remember that this transition occurred until the detector receives a reset signal (the clockstart signal). The transition detector accommodates the fact that the incoming signal originates from another clock domain by sampling twice, at the local domain base clock rate, the incoming clock status signal using flip-flops 80 and 82, described below, in order to eliminate any metastability. The circuit includes three serially connected flip-flops 80, 82 and 84, each clocked by the domain base clock signal, sysclk. Flip-flop 80 receives the clock status signal. Flip-flop 82 receives the Output of flip-flop 80 and flip-flop 84 receives the output of flip-flop 82. It will be recognized by those skilled in the art that the output of flip-flop 82 is guaranteed to be either high or low at any time. A first AND gate 86 receives the output of second flip-flop 82 and the inverted output of third flip-flop 84. A second AND gate 88 receives the output of the detector and an inverted reset signal, which, as previously mentioned, is the clockstart signal. An OR gate 90 receives the outputs of AND gates 86 and 88. A fourth flip-flop 92, clocked by the domain base clock signal receives the output of OR gate 90 and outputs a transition detector output. When the output of AND gate 86 becomes active, an active transition of the input signal has been detected. The output of flip-flop 92 is then set to its active value and fed back to one input of AND gate 88. As long as the output of the flip-flop is active and the reset signal in inactive, the output of AND gate 88 and OR gate 90 will remain active regardless of the output of AND gate 86.

The test method of the present invention will now be described in detail with reference to FIGS. 2 and 3. The test method involves three primary test operations, including a shift-in or scan-in operation, a capture operation, and a shift-out operation. Each of these operation are conducted substantially concurrently on all clock domains.

Figure 2:
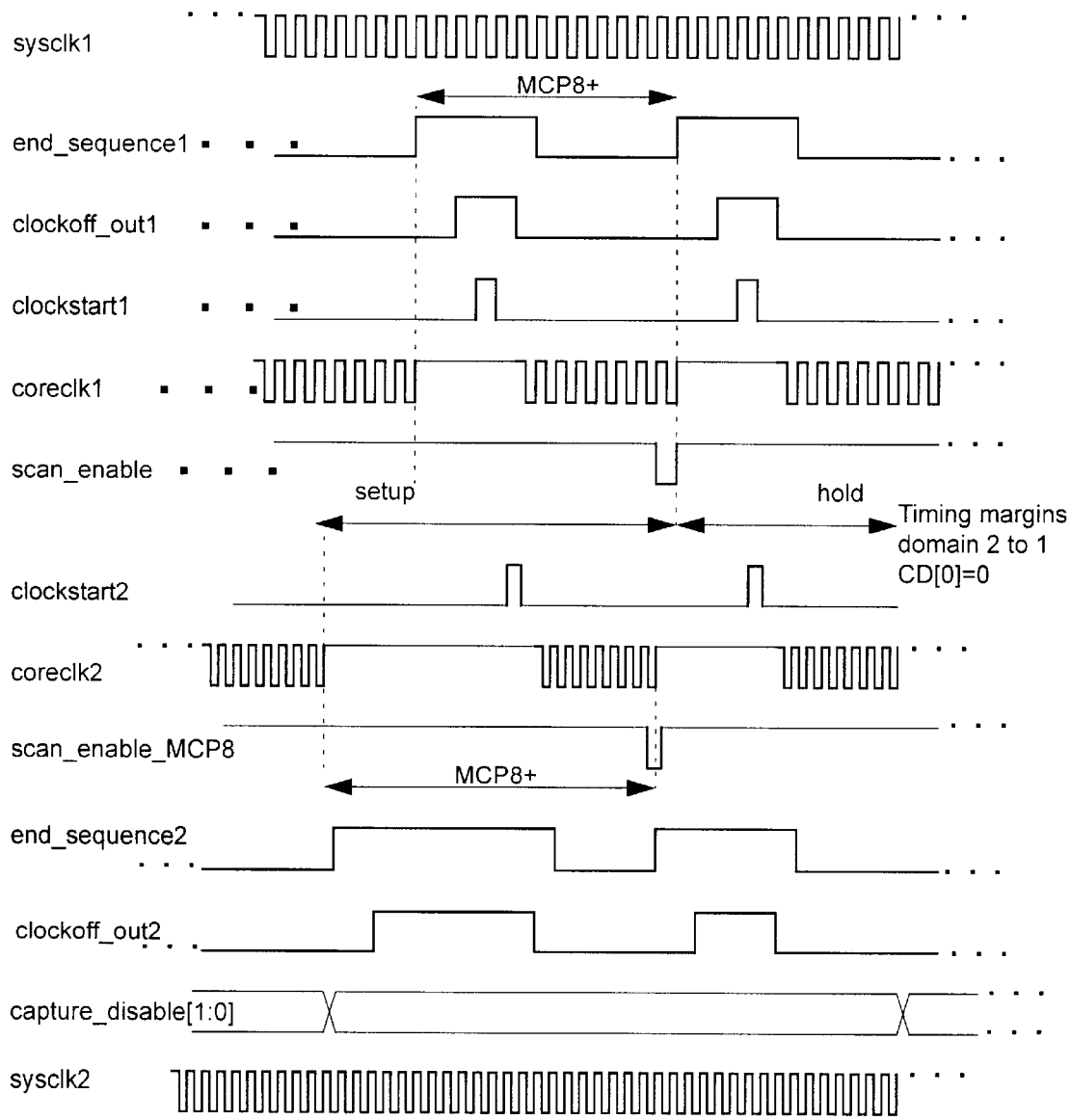
FIG. 2 is a timing diagram showing the behaviour of the key signals produced according to a preferred embodiment of the method of the present invention.

FIG. 2 is a timing diagram which illustrates the state of key signals in the vicinity of the capture operation. More specifically, the figure shows the terminal portion of a shift-in operation, a capture operation and the initial portion of a shift-out operation. While not shown in the FIG. 2, the shift-in operation was initiated concurrently in all clock domains by configuring all scanable memory elements in scan or shift mode in appropriate scan chains and scanning in a test pattern into each domain, in a manner well known in the art. The scan_enable and scan_enable_MCP8 were made active, so that both source and destination control elements 44 and 46 were also configured in shift mode.

In FIG. 2, signals associated with test controller 22 include the suffix "1" while signals associated with test controller 24 include the suffix "2". The top and bottom waveforms are the un-gated domain base clock signals, sysclk1 and sysclk2. It will also be noted that the end_sequence signals and clockstart signals are inactive. Thus, both coreclk1 and coreclk2 are active. The shift-in operations in both clock domains are based on their respective coreclk signals.

The first key point in the process will occur when the domain with the fastest clock completes its shift-in operation. Since the clock rate of sysclk2 is higher than that of sysclk1, test controller 24 will complete shifting-in of its test pattern before test controller 22. At the end of the shift-in operation, controller 24 forces end_sequence2 active. The signal is applied to AND gate 76 through latch 74. Since clockstart2 is inactive, the output of the AND gate becomes active, forcing coreclk2 high and stopping coreclk2. Thus, the sub-circuits of test controller 24 and all the core logic which are driven by coreclk2 are stopped. The end_sequence signals are generated by the clock signal generator circuit 38 which is driven by coreclk2. Thus, end_sequence2 will be held in an active state until coreclk2 is restarted.

End_sequence2 is also applied to delay circuit 72. The delay circuit and other components of the clock controller are clocked by sysclk2 which has not been stopped. Therefore, these components continue to operate. After a predetermined delay, the delay circuit generates an active clock status signal, clockoff_out2, and applies the signal to AND gate 64. At this point, the clock status input (shown as clockoff_out1 in FIG. 2) from clock domain 14 is inactive because controller 22 has not yet completed its shift-in operation. Accordingly, the output of AND gate 64 in the clock controller of test controller 24 remains inactive.

The active clockoff_out2 signal appears at its corresponding input of a transition detector 62 of the clock controller 30 in test controller 22 which, after detecting the active edge of the signal, applies an active signal to its AND gate 64.

The other input of AND gate 64 in clock controller 30 will be inactive. Test controller 22 will continue its shift-in operation until the last bit of its test pattern sequence has been shifted-in. At that point, the clock signal generator 38 in test controller 22 applies an active end_sequence1 signal to clock controller 30 which stops coreclk1 and causes an active clockoff_out1 to be output, after a predetermined delay, to AND gate 64 in clock controller 30 and to its corresponding transition detector 62 in test controller 24.

At this point, both test controllers have completed their respective shift-in operations, and coreclk1 and coreclk2 have been stopped. Since sysclk1 and sysclk2 are still active, the clock controllers in both controllers continue to operate.

With reference to test controller 22, it will be recalled that the output of transition detector 62 was already active when end_sequence1 became active. Accordingly, when clockoff_out1 becomes active, the output of AND gate 64 becomes active, and is re-timed by flip-flop 66 which generates an active clockstart1 signal in clock controller 30. The active clockstart1 signal is fed back to the reset input of transition detector 62, thereby resetting the transition detector for the next test operation. This forces its output low, causing the output of AND gate 64 to become inactive and, consequently making the clockstart1 signal inactive. The clockstart signal is active for only one cycle of sysclk.

The active clockstart signal was also applied to delay circuit 68. After an appropriate delay, the clockstart_delayed signal is output, inverted and applied to AND gate 76, forcing the output of the AND gate low and, thereby, restarting coreclk1.

With reference to test controller 24, as soon as it receives the active clockoff out1 signal from controller 22, its transition detector 62 detects the active edge of clockoff out1 and applies an active signal to its corresponding input of AND gate 64. It will be recalled that the other input of AND gate 64 is already active. As with the corresponding detector in controller 22, this results in an active clockstart2 signal, resetting of transition detector 62 in test controller 24 and restarting of coreclk2. Both test controllers force their respective end_sequence signals, end_sequence1 and end_sequence2, low on the first active edge of their respective coreclk signals after restart. This is followed by their respective clockoff_out signals, clockoff_out1 and clockoff_out2, becoming inactive.

At this point both test controllers are ready to start the next operation, a capture operation. It will be noted from FIG. 2 that scan_enable and scan_enable_MCP8 are still active, so that source and destination control elements 44 and 46, respectively, are in shift mode. In fact, all scannable memory elements in both clock domains are still in shift mode. Test controller 24 has already generated the shareable capture_disable[x] signals at the end of its shift operation.

Specifically, it sets capture_disable[1] active and capture_disable[0] inactive to allow the signal path 40 to be tested or it sets capture_disable[1] inactive and capture_disable[0] active to allow other paths in clock domain 16 to be tested.

Both test controllers complete their shift-in operations at their respective coreclk rates, although no new data is necessarily shifted in. The purpose of this phase of the operation is to accommodate multi-cycle paths in the core logic which require a number of clock cycles for a signal to propagate from the output of one element to the input of the next or to traverse combinational logic. After a predetermined number of coreclk cycles in this mode, both test controllers force their respective scan_enable and scan_enable_MCP8 signals low, so as to configure all (with some exceptions) scanable memory elements in a capture mode. It also sets clock_enableMCP8 inactive. This means that source control element 44 will be configured in a hold mode to hold its output constant and that the destination element 46 will be configured in capture mode in the case signal path 40 is to be tested. On the next clock cycle, the data in all elements configured in capture mode is captured.

As soon as the capture is performed, both test controllers set their respective end_sequence signals active. The sequence of operations which occurs is the same as that described earlier and results in coreclk1 and coreclk2 being stopped and active clockoff_out1 and clockoff_out2 signals being generated. Ultimately, both detector circuits 62 will detect active clockoff_out signals and restart their respective coreclk signal. As soon as the coreclk signals restart, the shift-out operation will begin in each domain at its respective coreclk rate. If desired, a new test pattern may be shifted in concurrently with the captured data being shifted out. As with the shift-in and capture operations, as each test controller completes its phase of the operation, it will set its end_sequence signal active causing its clock to be stopped and an active clock status signal to be applied to the other test controller. The data shifted out of each scan chain of each domain may now be analysed in a manner well known in the art. When all domains have completed their shift-out operation, their respective coreclk signals will be enabled, and the next operation, if any, may proceed.

In summary, in the test procedure just described, a test pattern was concurrently shifted into all clock domains at their respective functional clock rates, the procedure accommodated multi-cycle paths prior to performing the capture operation, and the procedure captured data transmitted across clock domain boundaries. Importantly, the data output from the source control element across the domain boundary to its destination control element will be known so that the output of the destination control element will also be known and predictable. All of this was performed in a single scan-based procedure. The procedure was not dependent on the actual source clock signals, sysclk1 and sysclk2. While it is preferred to use the domain functional clocks to perform the test, any other clock signals may be used when domain functional clock signals are not available and the test signatures will be the same as those produced when domain functional clocks are used. It will also be noted that the system and method can easily accommodate any number of clock domains, and cross-boundary signals flowing from any domain to any other domain. All that is required is to provide each domain with a test controller having the clock controller described above and interconnecting the clock controllers in the manner explained and source and destination scanable control elements for testing cross-boundary signal paths.

It will be noted that the no assumptions are made about which test controller will reach the end of its shift or capture sequence first or last. The domain clock frequencies can in fact be changed and the test controllers will always generate the same signature eliminating the need to run the automation tools to generate new test signatures for different test conditions.

Few additions need to be added to existing automation tools to implement the method of the present invention. Existing rules need to be modified to verify that control signals coming from a test controller in a clock domain are not connected to other gates in the other clock domains with the exception of the capture_disable signals. Signal paths going across clock domains should be flagged. Flip-flops of a clock domain are identified by the fact that their clock originates from a different primary input or a different controller.

Most testers will not allow the use of asynchronous clocks in a test program. It is assumed that the domain base clock signals are generated on a load board or on-chip. The controllers can also be run at the same frequency in multiple passes. When the high frequency is used, the clock controller of the other controller would be programmed so that it does not exceed its normal speed of operation by using a clock divider normally found in the clock controller sub-circuit. The execution time of this second pass will typically be a little longer than that of for the first. However, the same signatures can be used for both passes and there is no need to re-run any of the other analysis tools.

It will be understood that various modifications and alterations may be made to the method and circuitry of the present invention without departing from the spirit of the invention as defined in the appended claims.

We claim:

1. In a method of testing the core logic in a digital system, said method including a sequence of test operations including a shift-in operation in which a test stimulus is shifted into scanable memory elements in said core logic, a capture operation in which data in said memory elements is captured, and a shift-out operation in which captured data is shifted out of said core logic for analysis, said method comprising the improvement, for each said test operation:

(a) at the beginning of each test operation, concurrently enabling the domain clock of each clock domain in said core logic;

(b) performing the test operation in each domain; and (c) at the end of each test operation in each domain, disabling the domain clock.

2. A method as defined in claim 1, said core logic having two or more clock domains operable at different domain base clock rates, said shift-in operation including concurrently shifting all but a predetermined number of bits of a test stimulus into each clock domain at the respective domain clock rate and then stopping the domain clock in each clock domain at the conclusion of said shift-in operation therein.

3. A method as defined in claim 2, said shift-in operation further including, after all clock domains have completed shifting-in all but said predetermined number of bits of a test stimulus and their respective domain clock has been stopped, concurrently re-enabling the respective domain clock of each clock domain and shifting said predetermined number of bits of into each said clock domains.

4. A method as defined in claim 3, said capture operation including capturing the input of each said scanable memory elements in each clock domain immediately after shifting-in said predetermined number of bits and then stopping the domain clock in each clock domain at the conclusion thereof.

5. A method as defined in claim 4, said shift-out operation including concurrently re-enabling the respective domain clock of each clock domain and shifting captured data out of each said clock domain at its respective base clock rate and then stopping the domain clock in each clock domain at the conclusion thereof.

6. A method as defined in claim 5, prior to shifting captured data out said clock domains, maintaining in hold mode scanable memory elements which are the source of signals traversing clock domain boundaries for a pre-determined number of clock cycles and configuring in shift mode scanable memory elements which are the destination of signals traversing clock domain boundary.

7. A method as defined in claim 6, further including configuring in a hold mode for a second predetermined number of clock cycles scanable memory elements which are the source of signals traversing multi-cycle paths.

8. A method as defined in claim 4, prior to shifting-in said predetermined number of bits of said test stimuli, configuring in hold mode scanable memory elements which are the source of signals traversing clock domain boundaries and configuring in capture mode scanable memory elements which are the destination of signals traversing clock domain boundary.

9. A method as defined in claim 1, said step of performing the test operation comprises performing the test operation at the functional clock frequency of each said clock domain.

10. A method as defined in claim 1, in which said core logic includes at least two clock domains having asynchronous clock frequencies with non-integer frequency ratios and at least one a cross-boundary domain signal path traversing the boundary between said at least two clock domains, each said signal path having a scanable source control element in one domain and an associated destination control element in the other domain, said method further including at the conclusion of said shift-in operation, for each said cross-boundary signal path, configuring one of said control elements in a capture mode and the other of said associated control elements in a hold or shift mode.

11. A method as defined in claim 10, said configuring step including configuring the source control element in a capture mode and its associated destination control element in a hold or shift mode.

12. A method as defined in claim 10, said configuring step including configuring the destination control element in a capture mode and its associated source control element in a hold mode.

13. A method as defined in claim 1, further including delaying enabling of said domain clock signal for a predetermined amount of time following said step of disabling the clock.

14. In a method of testing of the logic of digital systems having scanable core logic arranged in two or more clock domains and having asynchronous clocks with non-integer clock ratios and at least one cross-boundary signal path traversing the boundary of two clock domains, each signal path having a scanable source control element in one clock domain and an associated scanable destination control element in the other clock domain, said method comprising:

in each clock domain:
connecting scanable memory elements in at least one scan chain;
partially shifting a test stimulus into the scanable memory elements in said scan chain;
disabling the domain clock upon completion of said step of partially shifting;
for each cross-boundary signal path, configuring one of said control elements in a hold mode or shift mode and its associated control element in a capture mode;
when the domain clock has been disabled in all clock domains, concurrently enabling the domain clock of all clock domains;

completing shifting-in of the test stimulus into each clock domain and performing a capture operation at all scanable memory elements configured in capture mode;
in each clock domain, disabling the clock connected to said scanable memory elements at the conclusion of the capture operation;
when the domain clock has been disabled in all clock domains, enabling the clock in all clock domains; and
shifting the output response out of all scanable memory elements in each said scan chain.

15. In a method of testing the logic of digital systems having scanable core logic arranged in two or more clock domains and having asynchronous clocks with noninteger clock ratios and at least one cross-boundary signal path traversing the boundary between two clock domains and each cross-boundary signal having a scanable source control element in one said two domains and an associated scanable destination control element in the other of said two clock domain, the improvement comprising:

in each clock domain:
connecting scanable memory elements in at least one scan chain;
partially shifting a test stimulus into the scanable memory elements in said scan chain according to a shift sequence;
stopping the clock connected to said scanable memory elements at the end of the shift sequence;
outputting a domain clock disabled signal to all other clock domains;
for each cross-boundary signal path, configuring the source control element in a hold mode and its associated destination control element in a capture mode OR configuring the source control element in a capture mode and its associated destination control element in a hold or shift mode; configuring all other scanable memory elements in capture mode;
waiting for a pre-determined amount of time;
enabling the clock in all clock domains when domain clock disabled signals have been output by all clock domains;
completing shifting in of the test stimulus into each said domain and performing a capture operation according to a capture sequence;
in each clock domain, stopping the clock connected to the said scanable memory elements at the end of the capture sequence and outputting a clock disabled signal to all other clock domains;
waiting for a pre-determined amount of time;
enabling the clock in all clock domains after clock disabled signals have been received from by all clock domains; and
shifting out the output response of all scanable memory elements in each said scan chain.

16. A method as defined in claim 15, said step of partially shifting including shifting-in all but a predetermined number of bits of said test stimulus and said step of completing shifting including shifting-in of said predetermined number of bits.

17. In a clock controller for use in a test controller in a digital system, the improvement comprising:

a detector for receiving a disabled clock signal from all clock domains in said system and outputting an active clock start signal when an active disabled clock signal has been received from all of said clock domains; and a clock gating circuit for enabling an output clock signal in response to an active clock start signal from said detector and for disabling the output clock signal when an inactive clock start signal is received from said detector and an active end_sequence signal is received from said test controller; and a circuit for outputting an active disabled clock signal in response to an active end_sequence signal from said test controller and outputting an inactive disabled clock signal in response to an active clock start signal from said detector.

18. A clock controller as defined in claim 17, said clock gating circuit including:

first means responsive to an active end_sequence signal and an inactive clock start signal for generating a clock disabled signal; and second means responsive to and active end_sequence signal and an inactive clock start signal for disabling said clock signal and responsive to an active clock start signal for enabling said clock signal.

19. A clock controller as defined in claim 18, said second means further including means for sampling and holding said end_ sequence signal at the domain clock rate of said domain clock rate.

20. A clock controller as defined in claim 18, said first means further including delay means for delaying the output of said clock disabled signal for a predetermined number of clock cycles of said domain clock.

21. A clock controller as defined in claim 17, said detector further including delay means for delaying the output of said clock start signal for a predetermined number of clock cycles of said domain clock.

22. A clock controller as defined in claim 17, said detector including a plurality of transition detectors, each transition detector being associated with a predetermined one of other test controllers in said system, each transition detector being operable to detect an active transition of a clock disabled signal output by said associated one of said other test controllers for generating an active detected signal upon detecting an active transition.

23. A clock controller as defined in claim 22, said detector further including means for receiving the output of each said transition detectors and operable to generate an active clock start signal upon receiving an active detected signal from each said transition detectors and otherwise generating an inactive clock start signal.

24. A clock controller as defined in claim 17, said detector being clocked by a base clock signal and being operable to sample each said clock disabled signal at the clock rate of said base clock signal and to detect the active transition of each said clock disabled signal and output said clock start signal upon detecting said active transition of all clock disabled inputs.

25. A clock controller as defined in claim 17, said detector including a plurality of transition detectors each clocked by the same domain base clock signal and each operable to receive a clock disabled signal from a predetermined clock domain in said system, and gate means for receiving the output of each said transition detectors and for outputting an active clock start signal when the output of all of said transition detectors is active and otherwise outputting an inactive clock start signal, and re-timing means clocked by said domain base clock signal for re-timing said clock start signal.

26. A clock controller as defined in claim 25, each said transition detector including three serially connected flip-flops each clocked by said base clock signal, a first of said flip-flops receiving said clock disabled signal, a second of said flip-flips receiving the output of said first flip-flop and the third of said flip-flops receiving the output of said second flip-flop; a first AND gate for receiving the output of said second flip-flop and the inverted output of said third flip-flop, a second AND gate for receiving the output of said detector and an inverted reset signal, an OR gate for receiving the outputs of said AND gates and a fourth flip-flop clocked by said domain base clock signal for receiving the output of said OR gate and outputting a transition detector output.

27. A clock controller as defined in claim 17, said clock gating circuit including means for receiving an inverted clock start signal and a re-timed end_sequence signal for generating and outputting a domain core clock signal.

28. A clock controller as defined in claim 27, said means for receiving being an AND gate, further including means for re-timing said end_sequence signal.

29. A clock controller as defined in claim 28, further including an OR gate for receiving the output of said AND gate and a domain base clock signal and outputting a domain clock signal.

30. A clock controller as defined in claim 17, each said transition detector including three serially connected flip-flops each clocked by said base clock signal, a first of said flip-flops receiving said clock disabled signal, a second of said flip-flips receiving the output of said first flip-flop and the third of said flip-flops receiving the output of said second flip-flop; a first AND gate for receiving the output of said second flip-flop and the inverted output of said third flip-flop, a second AND gate for receiving the output of said detector and a reset signal, an OR gate for receiving the outputs of said AND gates and a fourth flip-flop clocked by said domain base clock signal for receiving the output of said OR gate and outputting a transition detector output.

31. In a clock controller for use in a test controller in a digital system, comprising:

a detector for receiving a disabled clock signal from all clock domains in said system and outputting a clock start signal when an active disabled clock signal has been received from all of said clock domains, said detector further including:

a plurality of transition detectors, each transition detector being associated with a predetermined one of other test controllers in said system, each transition detector being clocked by a same base clock signal and operable to sample said clock disabled signal at the clock rate of said domain clock signal and detect the active edge of said clock disabled signal output by said associated one of said other test controller for generating a detected signal upon detecting an active edge; and means for receiving the outputs of transition detectors and clock disabled output and generating an active clock start signal upon receiving a detected signal from each said transition detectors and an active clock disabled output; and delay means for delaying the output of said clock start signal for a predetermined number of clock cycles of the base clock in which said clock controller is located;

a clock gating circuit for outputting a domain core clock signal at a clock rate determined by the base clock signal when an active clock start signal is received from said detector or when an inactive end_sequence is received and, for outputting a constant domain core clock signal when an inactive clock start signal and an active end_sequence signal are received and, for generating a disabled clock signal when an inactive clock start signal is received from said detector and an active end_sequence is received, said clock generator including:

first means responsive to an active end_sequence signal for generating a clock disabled signal, said first means further including delay means for delaying the output of said clock disabled signal for a predetermined number of clock cycles of said domain base clock; and second means clocked by said domain base clock for sampling said end_sequence signal at the domain clock rate and responsive to an active end_sequence signal for stopping said clock and responsive to an active clock start signal for enabling said clock, said second means including an AND gate for receiving an inverted clock start signal and a re-timed end_sequence signal for generating and outputting said core clock enable signal; and an OR gate for receiving the output of said AND gate means and a domain base clock signal and outputting a domain clock signal.

* * * * *